United States Patent
Crisp et al.

(10) Patent No.: US 11,602,086 B2
(45) Date of Patent: Mar. 7, 2023

(54) COOLING COMPUTING MODULES OF A RACK-MOUNTABLE TRAY

(71) Applicant: Dell Products L.P., Round Rock, TX (US)

(72) Inventors: Richard A. Crisp, Austin, TX (US); Matthew B. Gilbert, Austin, TX (US); Corey D. Hartman, Hutto, TX (US)

(73) Assignee: Dell Products L.P., Round Rock, TX (US)

( * ) Notice: Subject to any disclaimer, the term of this patent is extended or adjusted under 35 U.S.C. 154(b) by 2 days.

(21) Appl. No.: 17/235,694

(22) Filed: Apr. 20, 2021

(65) Prior Publication Data

US 2022/0338386 A1 Oct. 20, 2022

(51) Int. Cl.
*H05K 7/20* (2006.01)
*G06F 1/20* (2006.01)

(52) U.S. Cl.
CPC ........ *H05K 7/20772* (2013.01); *G06F 1/20* (2013.01); *G06F 2200/201* (2013.01); *H05K 7/20254* (2013.01); *H05K 7/20727* (2013.01)

(58) Field of Classification Search
CPC ........ H05K 7/20772; H05K 7/20763–20781; H05K 7/20236; H05K 7/20254; G06F 1/20; G06F 2200/201
See application file for complete search history.

(56) References Cited

U.S. PATENT DOCUMENTS

| | | | |
|---|---|---|---|
| 6,621,693 B1* | 9/2003 | Potter | H01R 12/7082 360/99.18 |
| 9,622,379 B1* | 4/2017 | Campbell | H05K 7/20318 |
| 2014/0124174 A1* | 5/2014 | Campbell | H05K 7/20809 29/890.035 |
| 2015/0334880 A1* | 11/2015 | Best | H05K 7/20145 361/679.47 |
| 2017/0020023 A1* | 1/2017 | Yu | A47B 88/493 |
| 2017/0049009 A1* | 2/2017 | Steinke | H05K 7/20736 |
| 2017/0265335 A1* | 9/2017 | Szeremeta | H05K 7/1489 |
| 2018/0295751 A1* | 10/2018 | Jochim | H05K 7/1489 |
| 2021/0345511 A1* | 11/2021 | Leigh | G02B 6/43 |
| 2021/0352830 A1* | 11/2021 | Varela Benitez | H05K 7/20272 |

FOREIGN PATENT DOCUMENTS

TW 501001 B * 9/2002

* cited by examiner

*Primary Examiner* — Zachary Pape
(74) *Attorney, Agent, or Firm* — McDermott Will & Emery LLP

(57) ABSTRACT

An information handling system, including a plurality of computing modules; a rack-mountable tray including: a plurality of bays, each bay including a cold fluid intake and a warm fluid return, wherein each computing module of the plurality of computing modules is engaged with the cold fluid intake and the warm fluid return of one or more of the bays of the plurality of bays; and a fluid circulation system positioned within the tray and coupled to the cold fluid intake and the warm fluid return of each of the bays, the fluid circulation system introducing, for each bay that a respective computing module is engaged with, fluid within the computing module via the cold fluid intake of each bay and returning warm fluid via the warm fluid return of each bay to transfer heat from the computing modules.

20 Claims, 17 Drawing Sheets

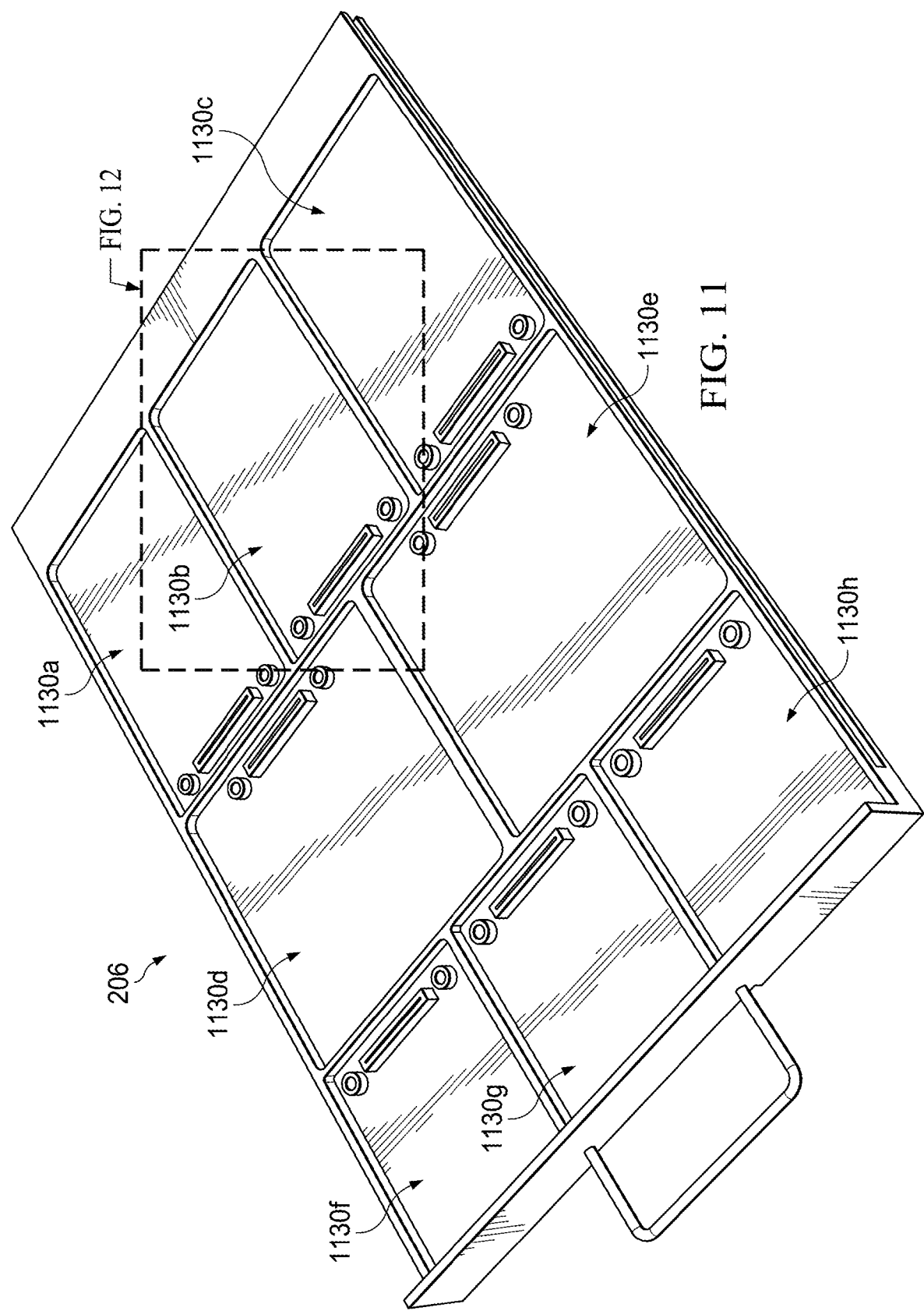

COOLING COMPUTING MODULES OF A RACK-MOUNTABLE TRAY

BACKGROUND

Field of the Disclosure

The disclosure relates generally to cooling computing modules of a rack-mountable tray.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Traditionally cooled system chassis may not provide uniform cooling, leading to difficulties in thermal management, or energy efficiency challenges.

SUMMARY

Innovative aspects of the subject matter described in this specification may be embodied in an information handling system, including: a plurality of computing modules; a rack-mountable tray including: a plurality of bays, each bay including a cold fluid intake and a warm fluid return, wherein each computing module of the plurality of computing modules is engaged with the cold fluid intake and the warm fluid return of one or more of the bays of the plurality of bays; and a fluid circulation system positioned within the tray and coupled to the cold fluid intake and the warm fluid return of each of the bays, the fluid circulation system introducing, for each bay that a respective computing module is engaged with, fluid within the computing module via the cold fluid intake of each bay and returning warm fluid via the warm fluid return of each bay to transfer heat from the computing modules.

Other embodiments of these aspects include corresponding methods, systems, apparatus, and computer programs, configured to perform the actions of the methods, encoded on computer storage devices.

These and other embodiments may each optionally include one or more of the following features. For instance, each of the bays further includes one or more interconnects for engaging with the respective computing module. The tray further includes a data delivery system and a power delivery system, wherein the interconnects couple the computing modules with the data delivery system and the power delivery system. The fluid is a water-based fluid. Further including an air circulation system coupled to the tray to further transfer heat from the computing modules. A particular computing module of the plurality of computing modules is engaged with at least two bays of the plurality of bays.

The details of one or more embodiments of the subject matter described in this specification are set forth in the accompanying drawings and the description below. Other potential features, aspects, and advantages of the subject matter will become apparent from the description, the drawings, and the claims.

BRIEF DESCRIPTION OF DRAWINGS

FIG. 11 illustrates a further example of the tray.

DESCRIPTION OF PARTICULAR EMBODIMENT(S)

Figure 1:
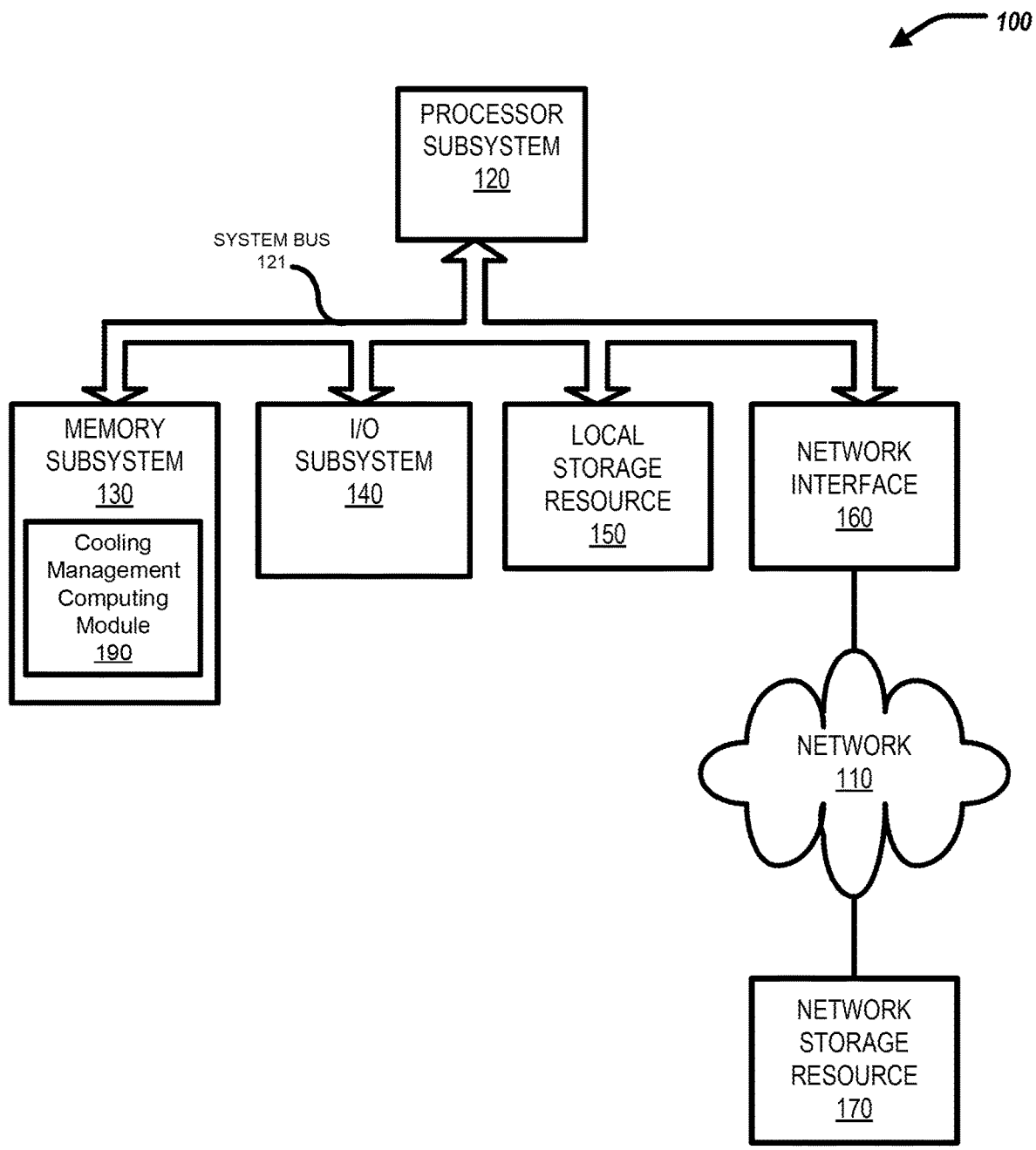
FIG. 1 is a block diagram of selected elements of an embodiment of an information handling system.

This disclosure discusses methods and systems for cooling of computing modules of a rack-mountable tray. In short, the tray can facilitate providing coolant to (and cooling of) the computing modules. That is, the tray can transfer heat from the computing modules via fluid exchange (ingress of cold/cool fluid to the computing modules, and egress of warm fluid from near the computing modules). The heat of the computing modules can be transferred to the fluid that is circulated, described further herein.

This disclosure further discusses liquid immersion cooling of the computing modules, which may be self-contained and sealed from an environment of the tray.

Specifically, this disclosure discusses an information handling system, includes a plurality of computing modules; a rack-mountable tray including: a plurality of bays, each bay including a thermal pad, wherein i) each computing module is engaged with one or more of the bays of the plurality of bays and ii) one or more of the thermal pads are in thermal communication with a respective computing module of the plurality of computing modules; and a fluid circulation system positioned within the tray and coupled to each of the thermal pads, the fluid circulation system circulating fluid proximate to the thermal pads to transfer heat from the computing modules through the thermal pads.

This disclosure further discusses an information handling system, including a plurality of computing modules; a rack-mountable tray including: a plurality of bays, each bay including a cold fluid intake and a warm fluid return, wherein each computing module of the plurality of computing modules is engaged with the cold fluid intake and the warm fluid return of one or more of the bays of the plurality of bays; and a fluid circulation system positioned within the tray and coupled to the cold fluid intake and the warm fluid return of each of the bays, the fluid circulation system introducing, for each bay that a respective computing module is engaged with, fluid within the computing module via the cold fluid intake of each bay and returning warm fluid via the warm fluid return of each bay to transfer heat from the computing modules.

This disclosure further discusses a computing module apparatus for use in a rack-mountable tray, the computing module apparatus including: one or more walls defined between a top surface and a bottom surface, wherein the walls, the top surface, and the bottom surface define an interior volume of the computing module; one or more computing components positioned within the interior volume of the computing module; an immersion fluid contained within the interior volume of the computing module and surrounding the computing components; and one or more mechanical interconnects for mechanical coupling the computing module with the rack-mountable tray.

In the following description, details are set forth by way of example to facilitate discussion of the disclosed subject matter. It should be apparent to a person of ordinary skill in the field, however, that the disclosed embodiments are exemplary and not exhaustive of all possible embodiments.

For the purposes of this disclosure, an information handling system may include an instrumentality or aggregate of instrumentalities operable to compute, classify, process, transmit, receive, retrieve, originate, switch, store, display, manifest, detect, record, reproduce, handle, or utilize various forms of information, intelligence, or data for business, scientific, control, entertainment, or other purposes. For example, an information handling system may be a personal computer, a PDA, a consumer electronic device, a network storage device, or another suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include an instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory (SSD); as well as communications media such wires, optical fibers, microwaves, radio waves, and other electromagnetic and/or optical carriers; and/or any combination of the foregoing.

Particular embodiments are best understood by reference to FIGS. 1-14 wherein like numbers are used to indicate like and corresponding parts.

Turning now to the drawings, FIG. 1 illustrates a block diagram depicting selected elements of an information handling system 100 in accordance with some embodiments of the present disclosure. In various embodiments, information handling system 100 may represent different types of portable information handling systems, such as, display devices, head mounted displays, head mount display systems, smart phones, tablet computers, notebook computers, media players, digital cameras, 2-in-1 tablet-laptop combination computers, and wireless organizers, or other types of portable information handling systems. In one or more embodiments, information handling system 100 may also represent other types of information handling systems, including desktop computers, server systems, controllers, and microcontroller units, among other types of information handling systems. Components of information handling system 100 may include, but are not limited to, a processor subsystem 120, which may comprise one or more processors, and system bus 121 that communicatively couples various system components to processor subsystem 120 including, for example, a memory subsystem 130, an I/O subsystem 140, a local storage resource 150, and a network interface 160. System bus 121 may represent a variety of suitable types of bus structures, e.g., a memory bus, a peripheral bus, or a local bus using various bus architectures in selected embodiments. For example, such architectures may include, but are not limited to, Micro Channel Architecture (MCA) bus, Industry Standard Architecture (ISA) bus, Enhanced ISA (EISA) bus, Peripheral Component Interconnect (PCI) bus, PCI-Express bus, HyperTransport (HT) bus, and Video Electronics Standards Association (VESA) local bus.

As depicted in FIG. 1, processor subsystem 120 may comprise a system, device, or apparatus operable to interpret and/or execute program instructions and/or process data, and may include a microprocessor, microcontroller, digital signal processor (DSP), application specific integrated circuit (ASIC), or another digital or analog circuitry configured to interpret and/or execute program instructions and/or process data. In some embodiments, processor subsystem 120 may interpret and/or execute program instructions and/or process data stored locally (e.g., in memory subsystem 130 and/or another component of information handling system). In the same or alternative embodiments, processor subsystem 120 may interpret and/or execute program instructions and/or process data stored remotely (e.g., in network storage resource 170).

Also in FIG. 1, memory subsystem 130 may comprise a system, device, or apparatus operable to retain and/or retrieve program instructions and/or data for a period of time (e.g., computer-readable media). Memory subsystem 130 may comprise random access memory (RAM), electrically erasable programmable read-only memory (EEPROM), a PCMCIA card, flash memory, magnetic storage, opto-magnetic storage, and/or a suitable selection and/or array of volatile or non-volatile memory that retains data after power to its associated information handling system, such as system 100, is powered down.

In information handling system 100, I/O subsystem 140 may comprise a system, device, or apparatus generally operable to receive and/or transmit data to/from/within information handling system 100. I/O subsystem 140 may represent, for example, a variety of communication interfaces, graphics interfaces, video interfaces, user input interfaces, and/or peripheral interfaces. In various embodiments, I/O subsystem 140 may be used to support various peripheral devices, such as a touch panel, a display adapter, a keyboard, an accelerometer, a touch pad, a gyroscope, an IR sensor, a microphone, a sensor, or a camera, or another type of peripheral device.

Local storage resource 150 may comprise computer-readable media (e.g., hard disk drive, floppy disk drive, CD-ROM, and/or other type of rotating storage media, flash memory, EEPROM, and/or another type of solid state storage media) and may be generally operable to store instructions and/or data. Likewise, the network storage resource may comprise computer-readable media (e.g., hard disk drive, floppy disk drive, CD-ROM, and/or other type of rotating storage media, flash memory, EEPROM, and/or other type of solid state storage media) and may be generally operable to store instructions and/or data.

In FIG. 1, network interface 160 may be a suitable system, apparatus, or device operable to serve as an interface between information handling system 100 and a network 110. Network interface 160 may enable information handling system 100 to communicate over network 110 using a suitable transmission protocol and/or standard, including, but not limited to, transmission protocols and/or standards enumerated below with respect to the discussion of network 110. In some embodiments, network interface 160 may be communicatively coupled via network 110 to a network storage resource 170. Network 110 may be a public network or a private (e.g. corporate) network. The network may be implemented as, or may be a part of, a storage area network (SAN), personal area network (PAN), local area network (LAN), a metropolitan area network (MAN), a wide area network (WAN), a wireless local area network (WLAN), a virtual private network (VPN), an intranet, the Internet or another appropriate architecture or system that facilitates the communication of signals, data and/or messages (generally referred to as data). Network interface 160 may enable wired and/or wireless communications (e.g., NFC or Bluetooth) to and/or from information handling system 100.

In particular embodiments, network 110 may include one or more routers for routing data between client information handling systems 100 and server information handling systems 100. A device (e.g., a client information handling system 100 or a server information handling system 100) on network 110 may be addressed by a corresponding network address including, for example, an Internet protocol (IP) address, an Internet name, a Windows Internet name service (WINS) name, a domain name or other system name. In particular embodiments, network 110 may include one or more logical groupings of network devices such as, for example, one or more sites (e.g. customer sites) or subnets. As an example, a corporate network may include potentially thousands of offices or branches, each with its own subnet (or multiple subnets) having many devices. One or more client information handling systems 100 may communicate with one or more server information handling systems 100 via any suitable connection including, for example, a modem connection, a LAN connection including the Ethernet or a broadband WAN connection including DSL, Cable, Ti, T3, Fiber Optics, Wi-Fi, or a mobile network connection including GSM, GPRS, 3G, or WiMax.

Network 110 may transmit data using a desired storage and/or communication protocol, including, but not limited to, Fibre Channel, Frame Relay, Asynchronous Transfer Mode (ATM), Internet protocol (IP), other packet-based protocol, small computer system interface (SCSI), Internet SCSI (iSCSI), Serial Attached SCSI (SAS) or another transport that operates with the SCSI protocol, advanced technology attachment (ATA), serial ATA (SATA), advanced technology attachment packet interface (ATAPI), serial storage architecture (SSA), integrated drive electronics (IDE), and/or any combination thereof. Network 110 and its various components may be implemented using hardware, software, or any combination thereof.

The information handling system 100 can also include a cooling management computing module 190. The cooling management computing module 190 can be included by the memory subsystem 130. The cooling management computing module 190 can include a computer-executable program (software). The cooling management computing module 190 can be executed by the processor subsystem 120.

Figure 2:
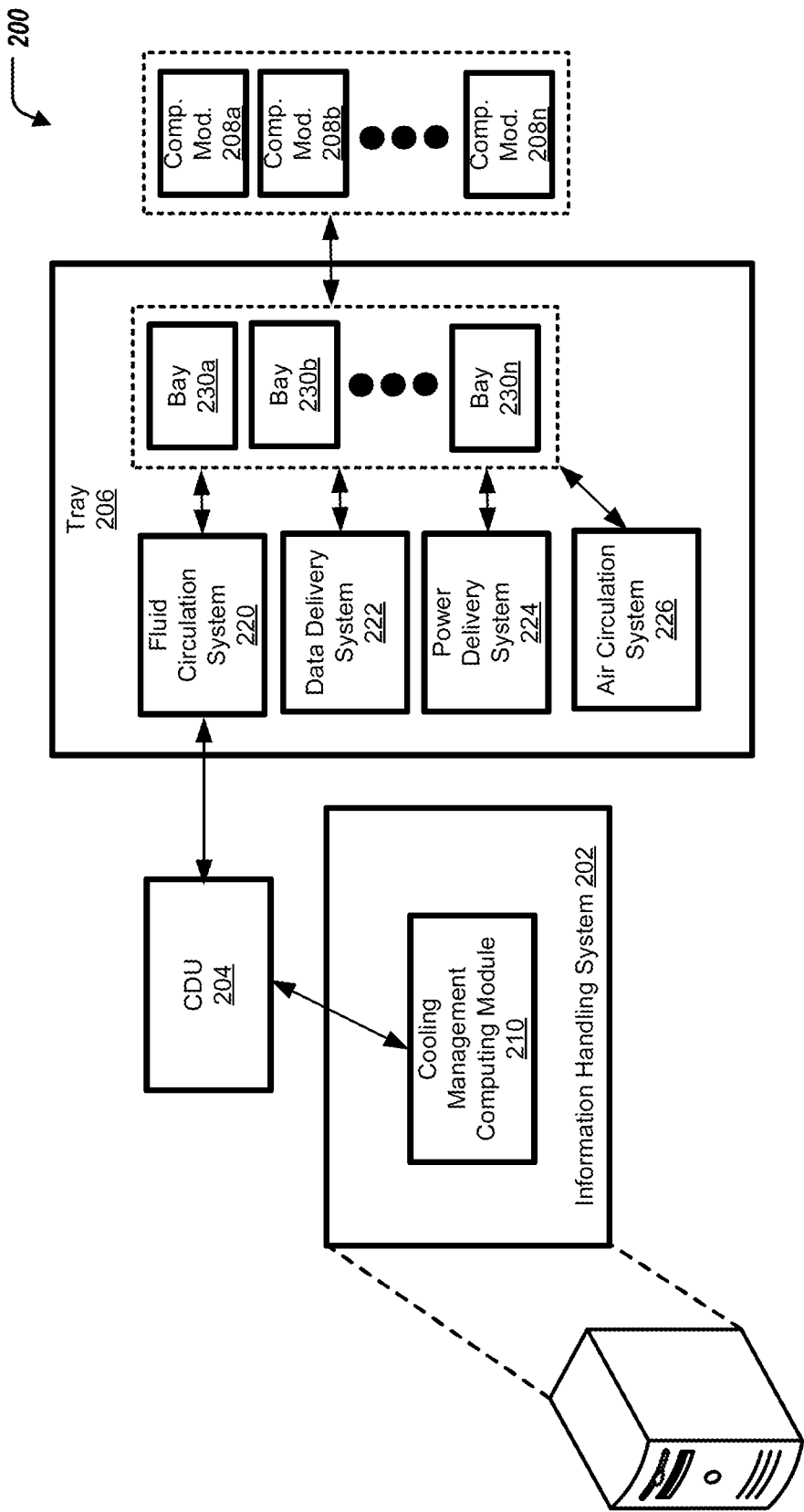
FIG. 2 illustrates a block diagram of an information handling system for cooling computing modules of a rack-mountable tray.

Turning to FIG. 2, FIG. 2 illustrates an environment 200 including an information handling system 202, a cooling distribution unit (CDU) 204, a tray 206, and computing modules 208*a*, 208*b*, . . . , 208*n* (collectively referred to as computing modules 208). The information handling system 202 can include a cooling management computing module 210. In some examples, the information handling system 202 is similar to, or includes, the information handling system 100 of FIG. 1. In some examples, the cooling management computing module 210 is the same, or substantially the same, as the cooling management computing module 190 of FIG. 1.

The tray 206 can further include a fluid circulation system 220, a data delivery system 222, a power delivery system 224, and an air circulation system 226. The tray 206 can further include a plurality of bays 230*a*, 230*b*, . . . , 230*n* (collectively referred to as bays 230). The fluid circulation system 220, the data delivery system 222, the power delivery system 224, and the air circulation system 226 may be in communication with the tray 206 and the bays 230. The tray 206 may be in communication with the computing modules 208, and specifically, one or more of the bays 230 will be in communication with one or more of the computing modules 208, described further herein.

The tray 206 may be a rack-mountable tray.

In some examples, the tray 206 can be considered an information handling system, a part (or portion) of an information handling system), or a part of a server farm (or server cluster). For example, the tray 206 and the computing modules 208 can be considered as an information handling system, or a part (or portion) of the information handling system.

In short, the tray 206 can facilitate providing coolant to (and cooling of) the computing modules 208, described further herein. That is, the tray 206 can transfer heat from the computing modules 208 via fluid exchange (ingress of cold/cool fluid to the computing modules 208, and egress of warm fluid from near the computing modules 208). The heat of the computing modules 208 can be transfer to the fluid that is circulated, described further herein.

Figure 3:
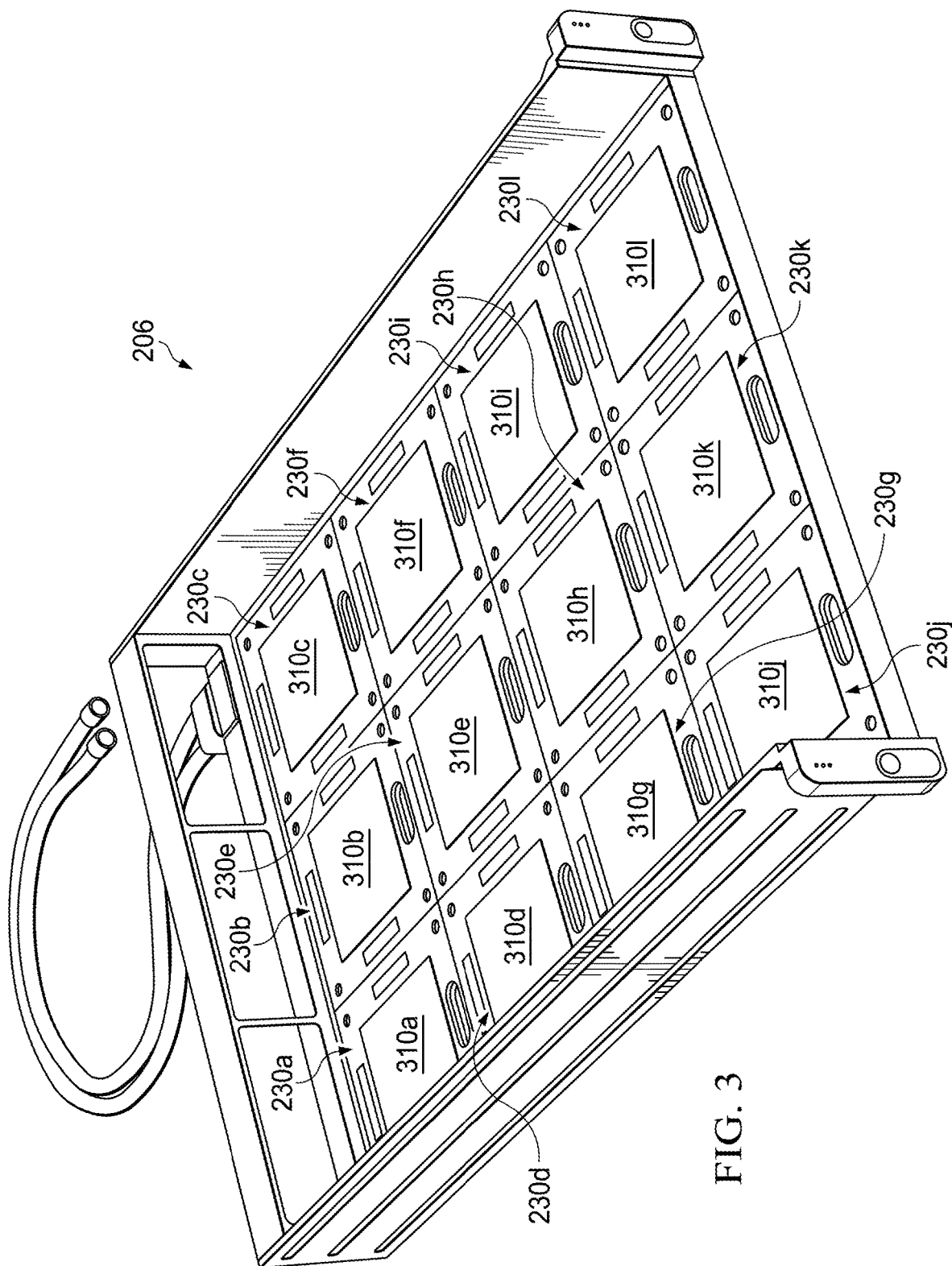
FIG. 3 illustrates an example of the tray.

FIG. 3 illustrates an example of the tray 206, including the plurality of bays 230. Specifically, the tray 206 can include bays 230*a*, 230*b*, 230*c*, 230*d*, 230*e*, 230*f*, 230*g*, 230*h*, 230*i*, 230*j*, 230*k*, 230*l* (collectively referred to as the bays 230). The tray 206 and the bays 230 allow various types of computing modules 208 (e.g., computing, storage, input/output, or combinations thereof) to be docketed/coupled to the tray 206.

Figure 4A:
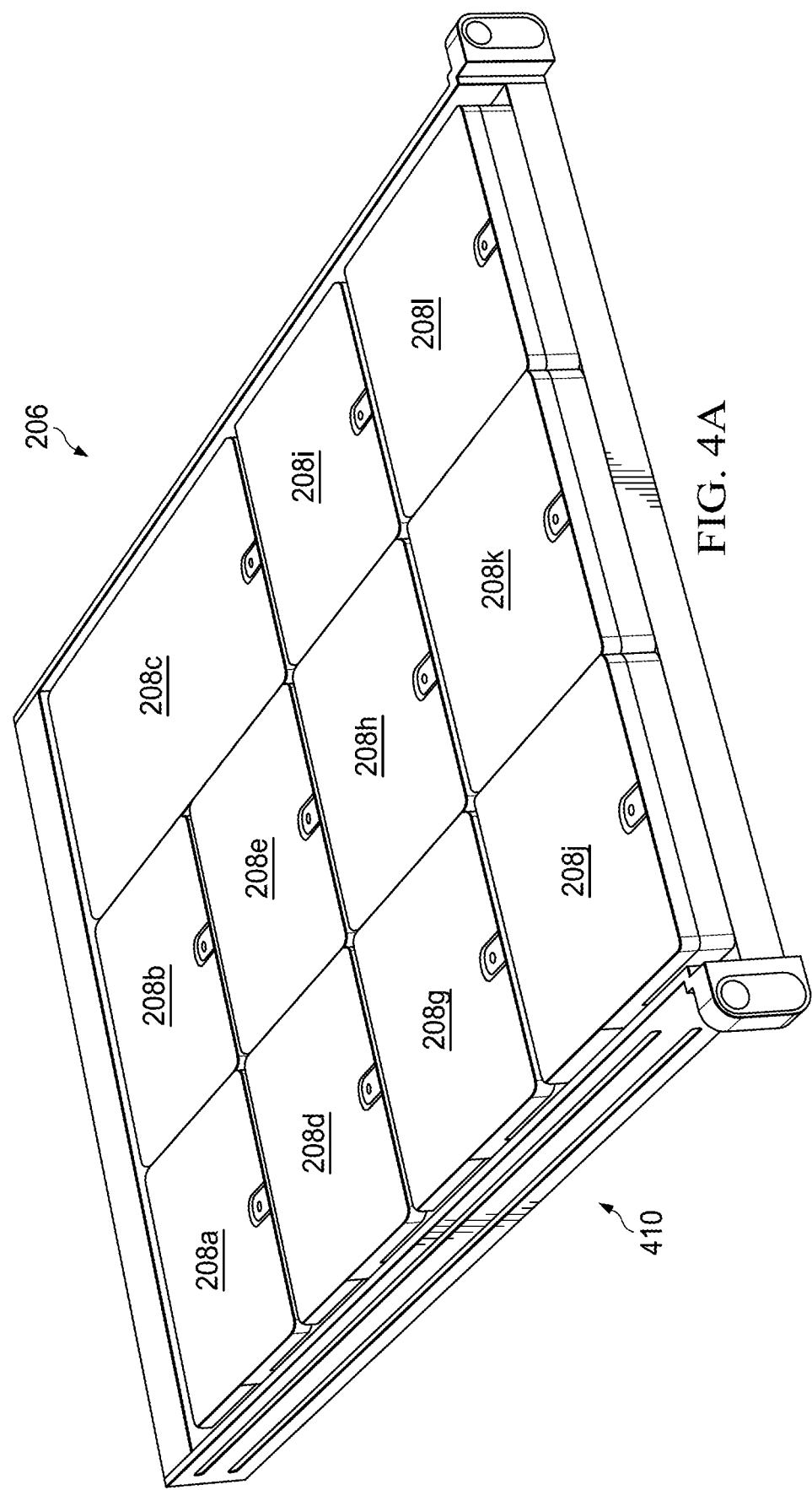
FIGS. 4A, 4B illustrates the tray with the computing modules engaged with bays of the tray.
Figure 4B:
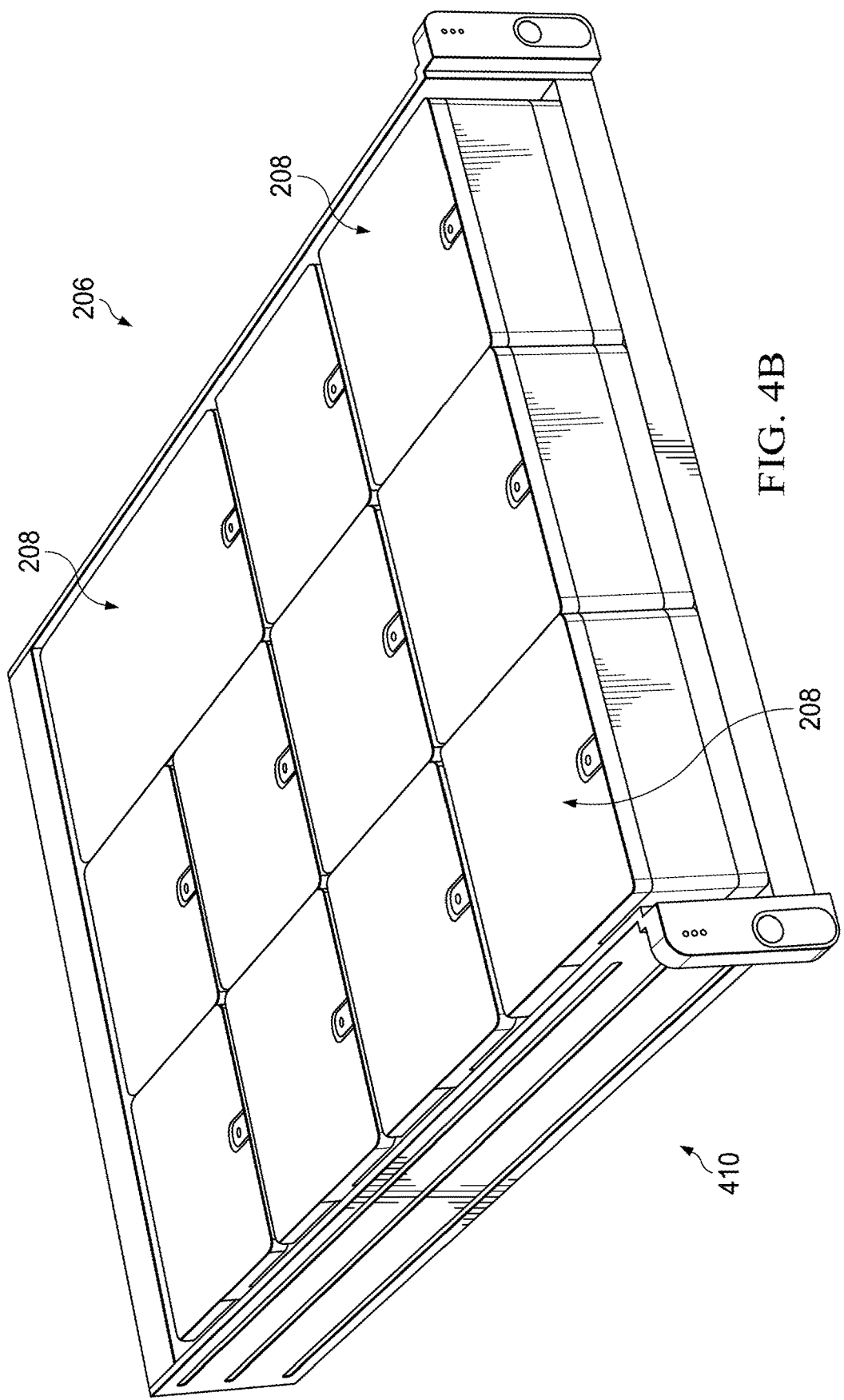

FIGS. 4A, 4B illustrates the tray 206 with the computing modules 208 engaged with the bays 230. Specifically, the computing module 208*a* is engaged with the bay 230*a*; the computing module 208*b* is engaged with the bay 230*b*; the computing module 208*c* is engaged with the bays 230*c*, 230*f*; the computing module 208*d* is engaged with the bay 230*d*; the computing module 208*e* is engaged with the bay 230*e*; the computing module 208*g* is engaged with the bay 230*g*; the computing module 208*h* is engaged with the bay 230*h*; the computing module 208*i* is engaged with the bay 230*i*; the computing module 208*j* is engaged with the bay 230*j*; the computing module 208*k* is engaged with the bay 230*k*; and the computing module 208*l* is engaged with the bay 230*l*. In some examples, a computing module 208 can be engaged with two or more bays 230.

The computing modules 208 can have varying heights, as shown in FIGS. 4A, 4B. That is, the tray 206 can be scalable to different depths (e.g., to meet different needs of a customer/user). To that end, the tray 206 can provide uniform, or substantially uniform, cooling to each portion of the tray 206, and in particular, each bay 230 and each computing module 208 coupled to each bay 230.

In some examples, the tray 206 can include a rail system 410 for installation in a standard computing rack.

As shown in FIG. 3, each of the bays 230 can include a respective thermal pad 310. Specifically, the bay 230*a* can include a thermal pad 310*a*; the bay 230*b* can include a thermal pad 310*b*; the bay 230*c* can include a thermal pad 310*c*; the bay 230*d* can include a thermal pad 310*d*; the bay 230*e* can include a thermal pad 310*e*; the bay 230*f* can include a thermal pad 310*f*; the bay 230*g* can include a thermal pad 310*g*; the bay 230*h* can include a thermal pad 310*h*; the bay 230*i* can include a thermal pad 310*i*; the bay 230*j* can include a thermal pad 310*j*; the bay 230*k* can include a thermal pad 310*k*; and the bay 230*l* can include a thermal pad 310*l*. The thermal pads 310*a*, 310*b*, 310*c*, 310*d*, 310*e*, 310*f*, 310*g*, 310*h*, 310*i*, 310*j*, 310*k*, 310*l* can be collectively referred to as the thermal pads 310.

To that end, the thermal pads 310 can be in thermal communication with one or more of the computing modules 208. Specifically, the thermal pads 310 can interface with the computing modules 208. In some examples, one or more of the thermal pads 310 are in contact with respective computing modules 208. In some examples, one or more of the thermal pads 310 is in close proximity with the respective computing modules 208, e.g., within nanometers, millimeters, or centimeters of the thermal pad 310.

In the illustrated example, as shown in FIGS. 3 and 4A, the thermal pad 310*a* is in thermal communication with the computing module 208*a*; the thermal pad 310*b* is in thermal communication with the computing module 208*b*; the thermal pads 310*c*, 310*f* are in thermal communication with the computing module 208*c*; the thermal pad 310*d* is in thermal communication with the computing module 208*d*; the thermal pad 310*e* is in thermal communication with the computing module 208*e*; the thermal pad 310*g* is in thermal communication with the computing module 208*g*; the thermal pad 310*h* is in thermal communication with the computing module 208*h*; the thermal pad 310*i* is in thermal communication with the computing module 208*i*; the thermal pad 310*j* is in thermal communication with the computing module 208*j*; the thermal pad 310*k* is in thermal communication with the computing module 208*k*; and the thermal pad 310*l* is in thermal communication with the computing module 208*l*.

Figure 5:
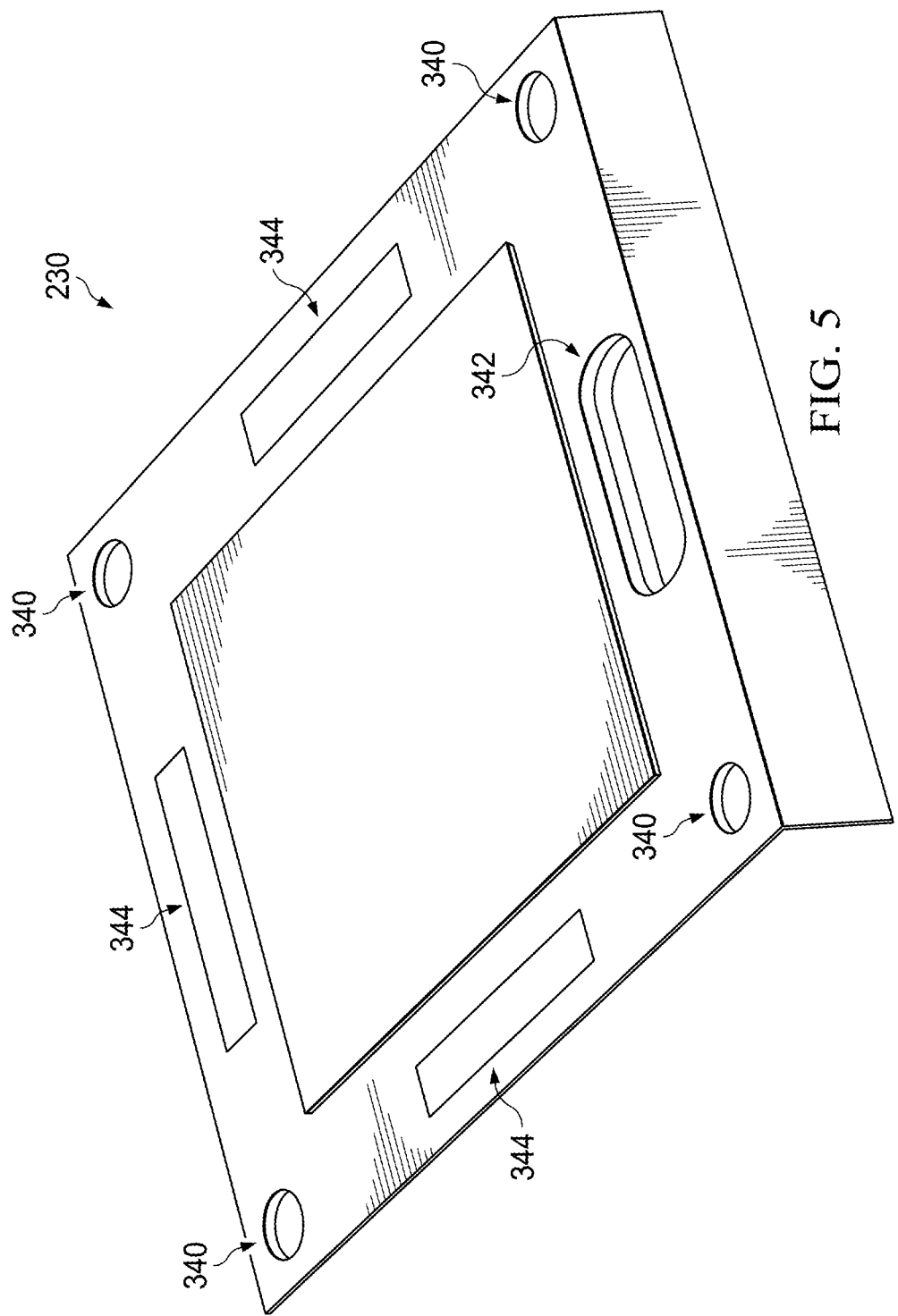
FIGS. 5, 12 illustrates a bay of the tray.

Referring to FIG. 5, a bay 230 of the tray 206 is shown. The bay 230 can include one or more mechanical interconnects 340 for mechanically engaging with the computing modules 208—e.g., the computing modules 208 can include tabs (not shown) for engaging with the mechanical interconnects 340*a*. The bay 230 can further include power interconnects 342 for interfacing with the power delivery system 224. The bay 230 can further include data interconnects 344 for interfacing with the data delivery system 222. The data interconnects 344 can include high-speed interconnects that allow flexibility in how each bay 230 is employed at the tray 206. For example, the data interconnects 344 can be associated with high-speed wire, optical, or printed circuit board (PCB) connections for memory, I/O transports, as well as CPU to CPU transports.

Figure 6:
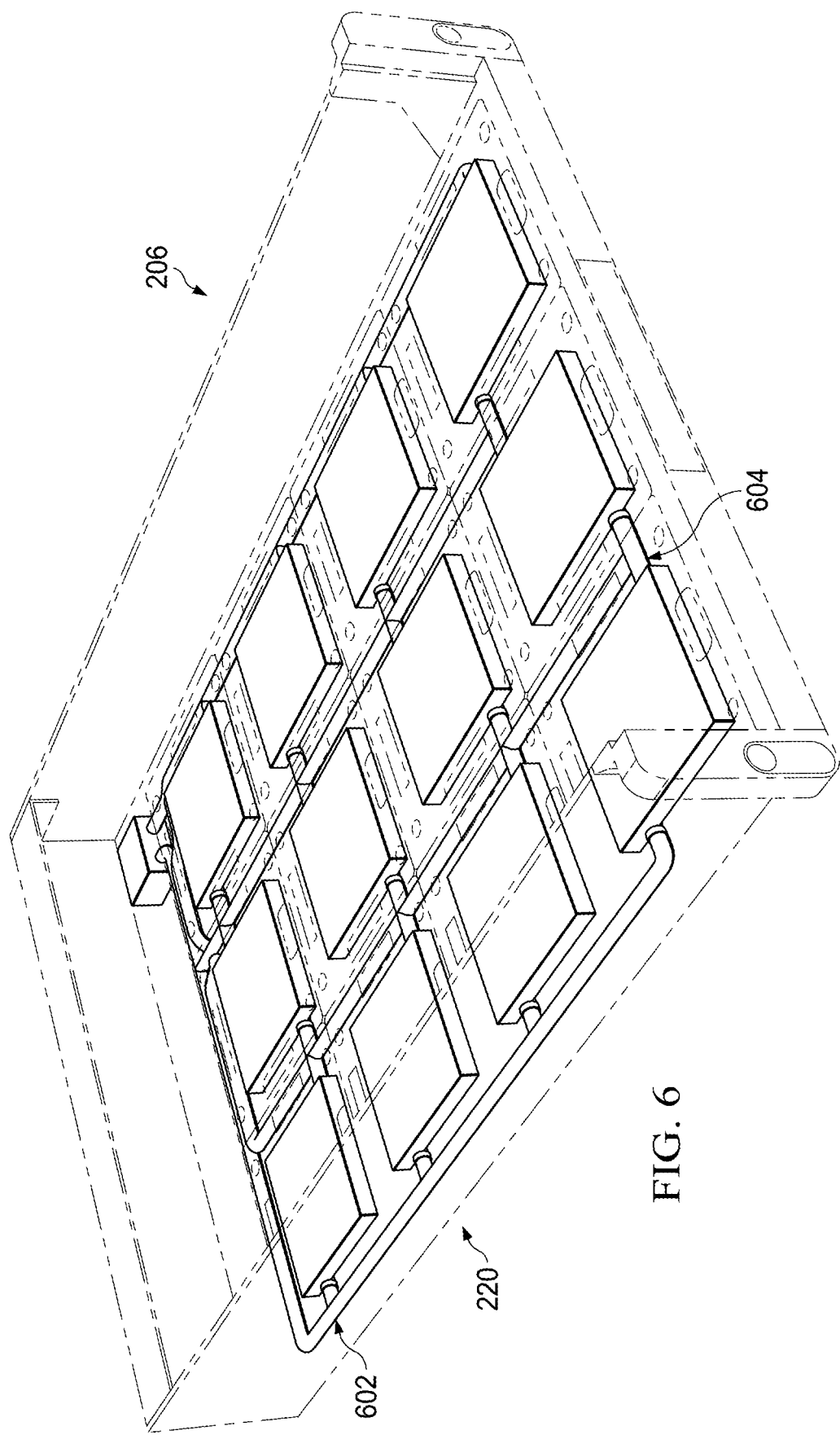
FIGS. 6, 13 illustrates the fluid circulation system of the tray.

FIG. 6 illustrates the fluid circulation system 220 of the tray 206. The fluid circulation system 220 can be, at least partially, positioned within the tray 206. The fluid circulation system 220 can be coupled to each of the bays 230, and specifically, each of the thermal pads 310. The fluid circulations system 220 can include a cold fluid intake line 602 and a warm fluid return line 604. Each of the bays 230, and specifically, each of the thermal pads 310, can include a cold fluid intake and warm fluid return.

The fluid circulation system 220 can circulate fluid within the lines 602, 604 such that fluid is circulated within the bays 230, and specifically, proximate to the thermal pads 310. Specifically, the CDU 204, in response to a signal from the cooling management computing module 210, can circulate fluid within fluid circulation system 220. The fluid circulation system 220 can provide cold/cool temperature fluid within the cold fluid intake lines 602 such that the cold/cool temperature fluid is brought to the bays 230, and specifically, proximate or within the thermal pads 310.

The thermal pads 310 can transfer heat from the computing modules 208 via the cold temperature fluid such that heat is transferred from the computing modules 208 to the thermal pads 310. The heat is transferred to the cold temperature fluid which in turn is extracted as warm temperature fluid via the warm fluid return line 604. In other words, the heat from the computing modules 208 is transferred to the thermal pads 208 that is in turn transferred to the fluid within the fluid circulation system 220. The fluid then can be removed from being proximate to the thermal pads 310, thus, transferring heat away from the computing modules 208, the bays 230, and the thermal pads 310. In some examples, the fluid is a water-based fluid. In some examples, the fluid is a dielectric-based fluid.

Figure 7:
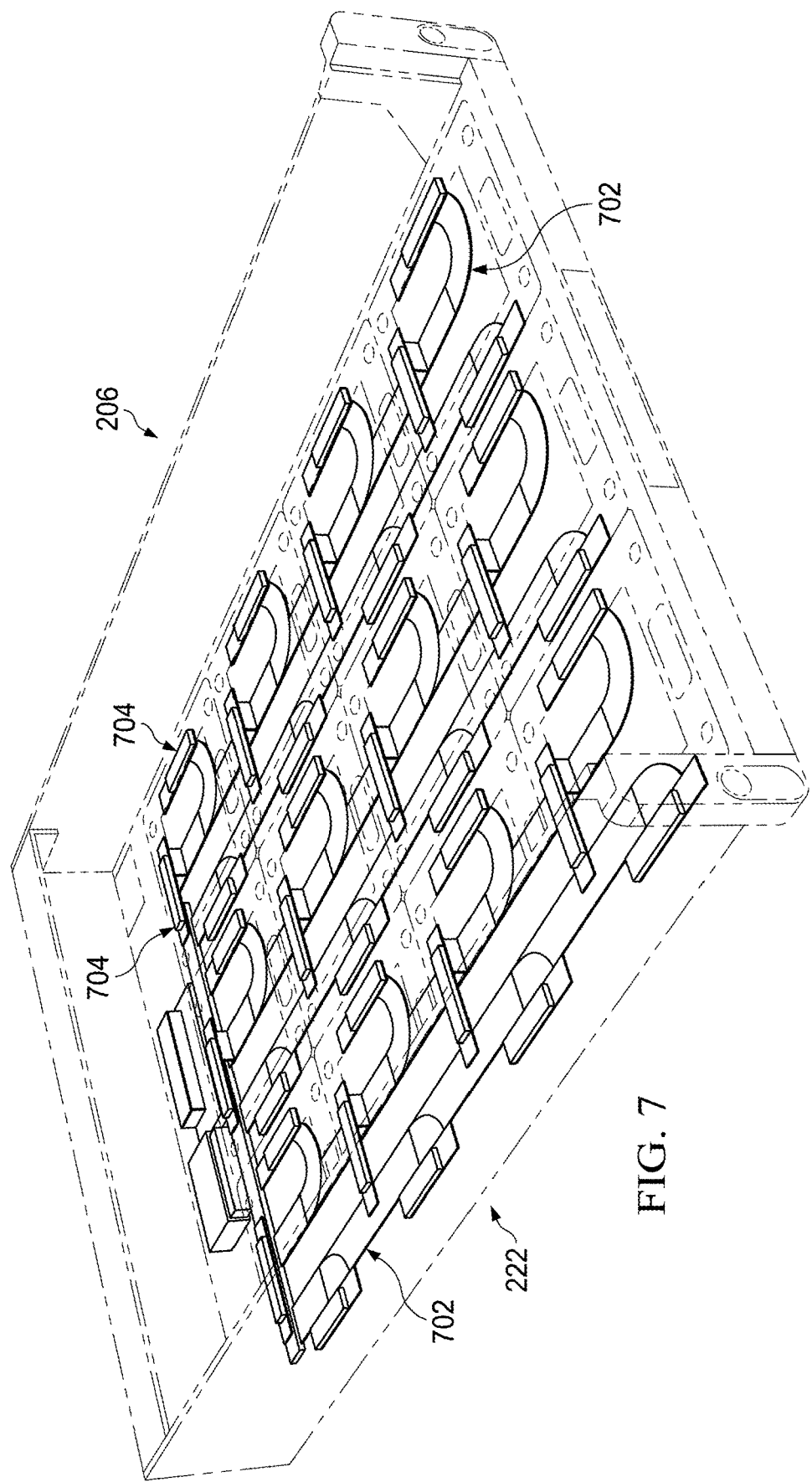
FIG. 7 illustrates the data delivery system of the tray

FIG. 7 illustrates the data delivery system 222 of the tray 206. The data delivery system 222 can include high-speed cables 702 and connectors 704 for each of the bays 230, and interconnected per architecture requirements. The data delivery system 222 can connect to the computing modules 208 via the data interconnects 344, shown in FIG. 5, for each of the respective bays 230. The data delivery system 222 can provide data transfer between the computing modules 208, between differing trays 206, and other computing resources in communication with the tray 206 and/or the computing modules 208.

Figure 8:
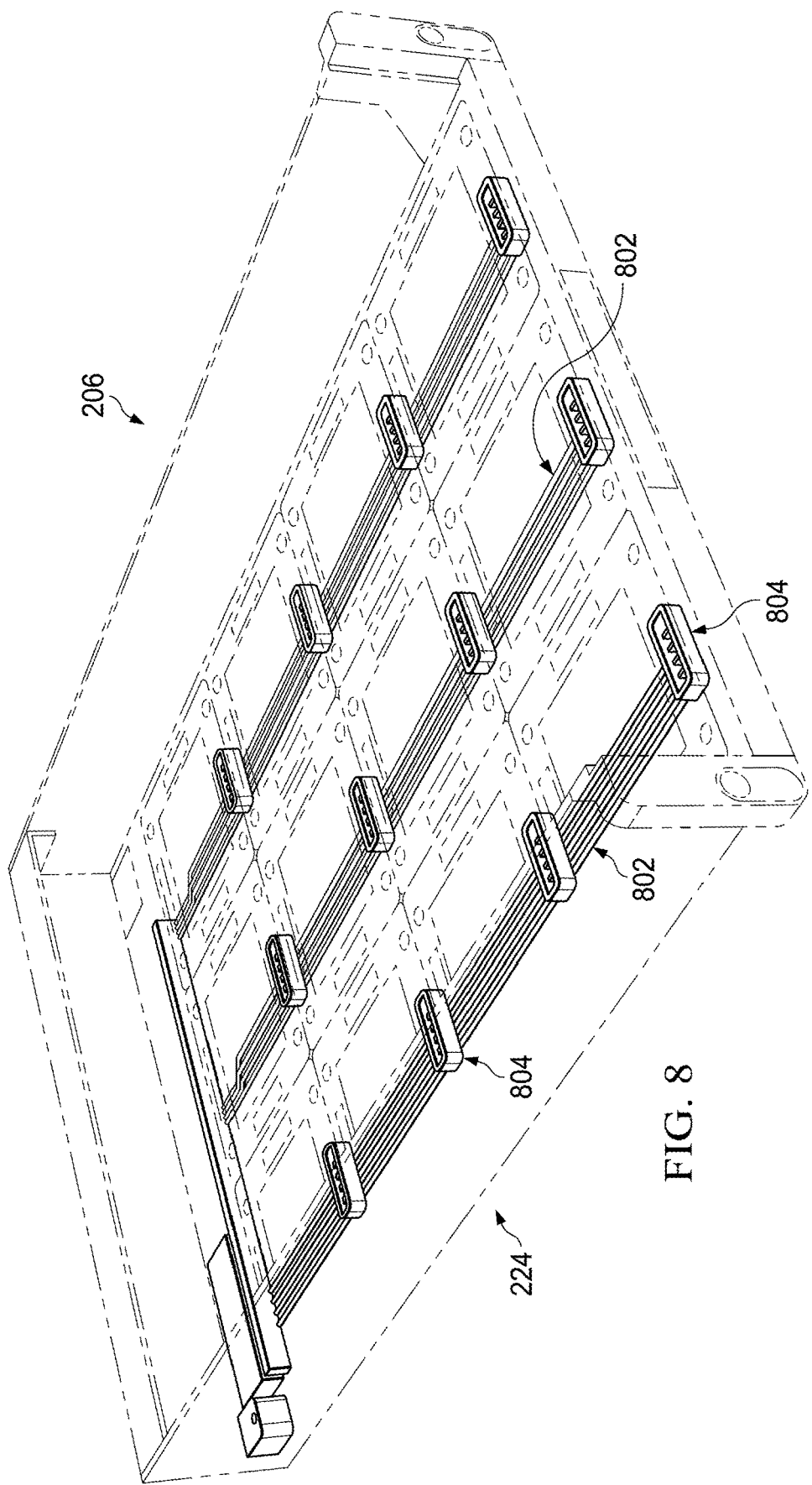
FIG. 8 illustrates the power delivery system of the tray.

FIG. 8 illustrates the power delivery system 224 of the tray 206. The power delivery system 224 can include a power supply unit (PSU) and/or a direct current (DC) conversion unit (both not shown). The power delivery system 224 can provide power to each of the computing modules 208, the bays 230, and/or the thermal pads 310. The power delivery system 224 can include cables 802 and connectors 804 for each of the bays 230 to connect to the computing modules 208 via the power interconnects 342, shown in FIG. 5, for each of the respective bays 230.

In some examples, the tray 206 can further include an air circulation system (not shown) to further transfer heat from the computing modules 208. The air circulation system can provide air cooling to the computing modules 208 to dissipate heat from an outer skin of the computing modules 208, and in some examples, in combination with external heatsinks coupled to the computing modules 208.

Figure 9:
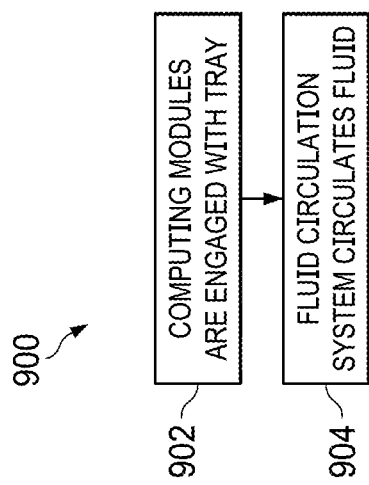

FIG. 9 illustrates a flowchart depicting selected elements of an embodiment of a method 900 for cooling computing modules of a rack-mountable tray. The method 900 may be performed by the information handling system 100, the information handling system 202, the cooling management computing module 210, the CDU 204, and/or the tray 206 and with reference to FIGS. 1-8. It is noted that certain operations described in method 900 may be optional or may be rearranged in different embodiments.

The computing modules 208 are engaged with respective bays 230 of the tray 206 (902). The fluid circulation system 220 circulates fluid proximate to the thermal pads 310 that are engaged with respective computing modules 208 to transfer heat from the computing modules 208 through the thermal pads 310 by introducing cold fluid within the thermal pads 310 and removing warm fluid from the thermal pads 310 (904).

Figure 10:
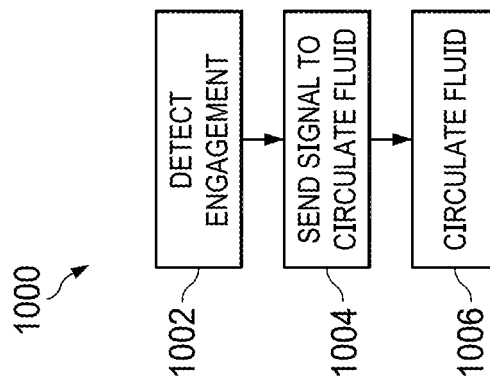
FIGS. 9, 10, and 14 illustrates a method for cooling computing modules of a rack-mountable tray.

FIG. 10 illustrates a flowchart depicting selected elements of an embodiment of a method 1000 for cooling computing modules of a rack-mountable tray. The method 1000 may be performed by the information handling system 100, the information handling system 202, the cooling management computing module 210, the CDU 204, and/or the tray 206, and with reference to FIGS. 1-8. It is noted that certain operations described in method 1000 may be optional or may be rearranged in different embodiments.

The cooling management computing module 210 detects engagement between the computing modules 208 and the bays 230 (1002). Specifically, the cooling management computing modules 210 receives a signal indicating that the computing modules 208 are engaged with the respective interconnects 340. The cooling management computing module 210, in response to detecting engagement between the computing modules 208 and the bays 230, sends a signal to the CDU 204 indicating to circulate fluid within the fluid circulation system 220 (1004). The CDU 204, in response to the signal, circulates fluid within the fluid circulation system 220 (1006).

FIG. 11 illustrates a further example of the tray 206, including a plurality of bays 1130. Specifically, the tray 206 can include bays 1130a, 1130b, 1130c, 1130d, 1130e, 1130f, 1130g, 1130h (collectively referred to as bays 1130). The tray 206 and the bays 1130 allow various types of computing modules 208 (e.g., computing, storage, input/output, or combinations thereof) to be docketed/coupled to the tray 206.

Similar to that mentioned with respect to FIGS. 4A, 4B, the tray 206 can include the computing modules 208 engaged with the bays 1130. In some examples, a computing module 208 can be engaged with two or more bays 1130.

Each of the bays 1130 can provide fluid ports to the respective computing modules 208. That is, the fluid (coolant) can be directed (pumped) directly into the computing modules 208 via the fluid ports, described further herein. For example, the computing modules 208 can include liquid-cooled immersion computing modules.

Figure 12:
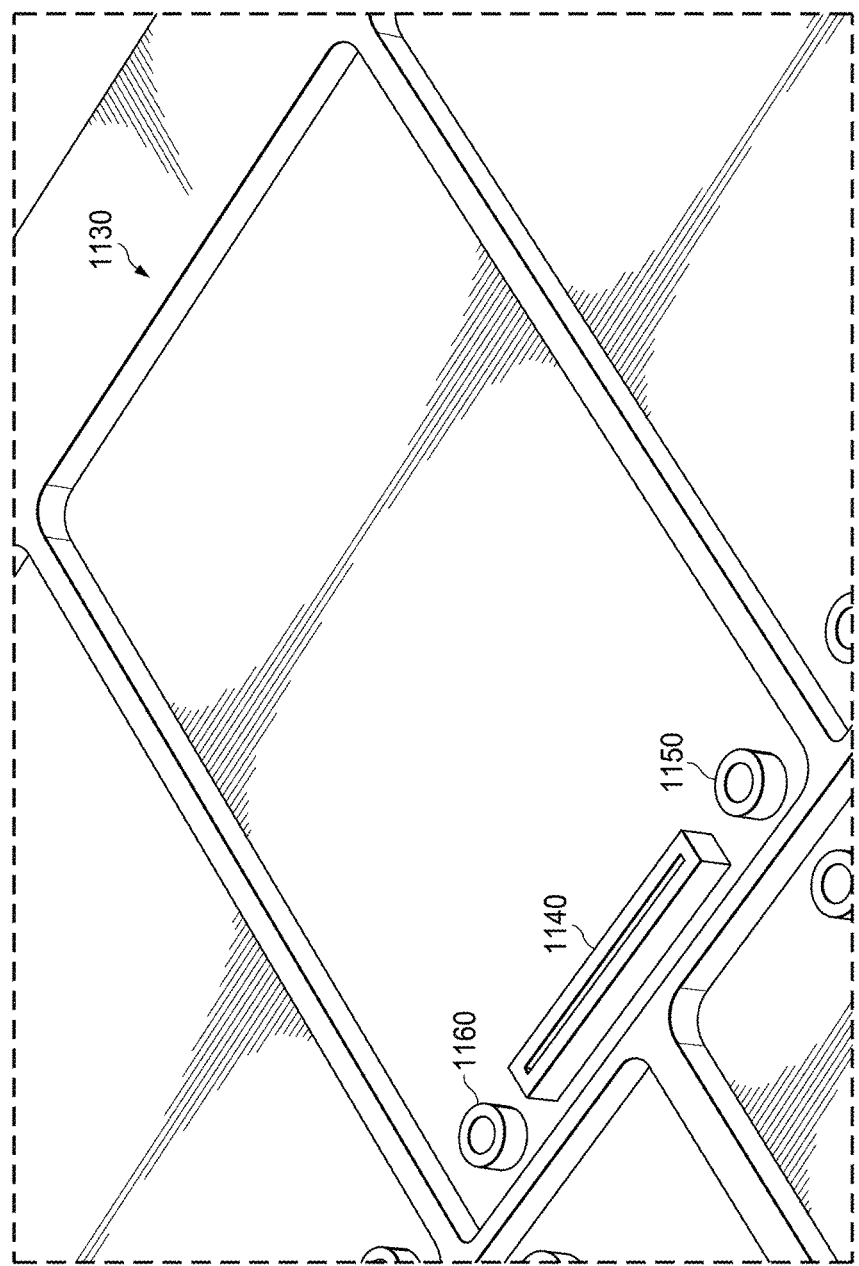

FIG. 12 illustrates a bay 1130 of the tray 206. The bay 1130 can include interconnects 1140 for engaging with the respective computing module 208. The interconnects 340 can interface with the data delivery system 222, and the power delivery system 224. The interconnects 1140 can include high-speed interconnects that allow flexibility in how each bay 1130 is employed at the tray 206. For example, the interconnects 1140 can be associated with high-speed wire, optical, or printed circuit board (PCB) connections for memory, I/O transports, as well as CPU to CPU transports.

The bay 1130 can further include a cold fluid intake 1150 and a warm fluid return 1160. The cold fluid intake 1150 and the warm fluid return 1160 can interface with the circulation system 220.

Figure 13:
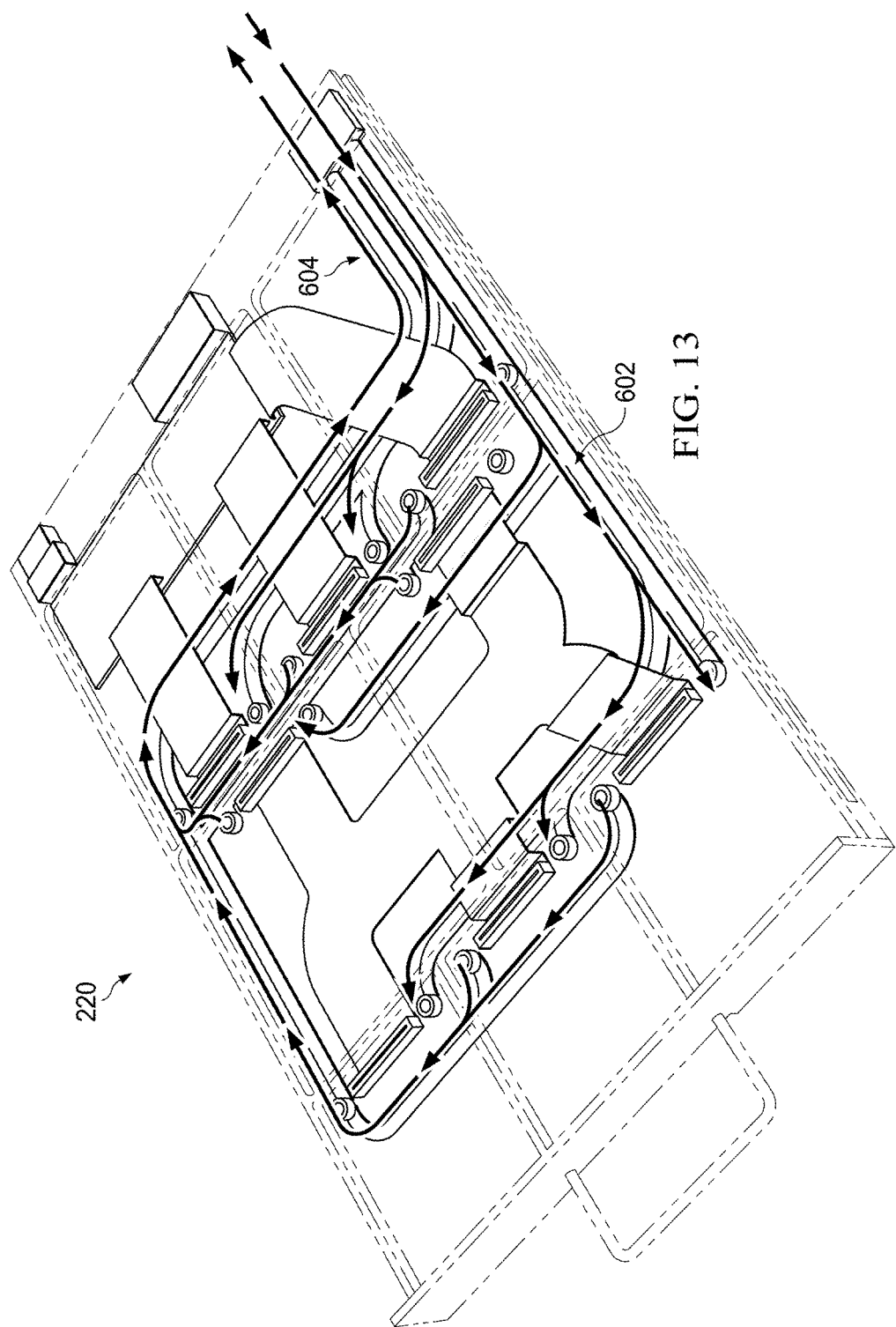

FIG. 13 illustrates the fluid circulation system 220 of the tray 206, in a further implementation. The fluid circulation system 220 can be positioned within the tray 206. The fluid circulation system 220 can be coupled to each of the bays 230, and specifically, each of the cold fluid intakes 1150 and warm water returns 1160 of each of the bays 230. Similar to that as shown in FIG. 6, the fluid circulation system 220 can include a cold fluid intake line 602 and a warm fluid return line 604.

The fluid circulations system 220 can introduce, for each bay 1130 that a respective computing module 208 is engaged with, fluid within the computing module 208 via the cold fluid intake 1150 of each bay 1130 and returns warm fluid via the warm fluid return 1160 of each bay 1130 to transfer heat from the computing modules 208.

Specifically, the fluid circulation system 220 can circulate fluid within the lines 602, 604 such that fluid is circulated within the computing modules 208. Specifically, the CDU 204, in response to a signal from the cooling management computing module 210, can circulate fluid within fluid circulation system 220. The fluid circulation system 220 can provide cold/cool temperature fluid within the cold fluid intake lines 602 such that the cold temperature fluid is brought to the computing modules 208, and specifically, within the computing modules 208.

The cold temperature fluid can transfer heat from within the computing modules 208. The heat is transferred to the cold temperature fluid which in turn is extracted as warm temperature fluid via the warm fluid return line 604. In other words, the heat from the computing modules 208 is transferred to cold temperature fluid that is introduced via the cold fluid intake fluid 1150. The fluid then can be removed from within the computing module 208 via the warm fluid return 1160, thus, transferring heat away from the computing modules 208. In some examples, the fluid is a water-based fluid.

Similar to that mentioned with respect to FIG. 7, the data delivery system 222 can connect to the computing modules 208 via the interconnects 1140, shown in FIG. 12, for each of the respective bays 230. The data delivery system 222 can provide data transfer between the computing modules 208, between differing trays 206, and other computing resources in communication with the tray 206 and/or the computing modules 208.

Similar to that mentioned with respect to FIG. 8, the power delivery system 224 can provide power to each of the computing modules 208, and/or the bays 1130. The power delivery system 224 can connect to the computing modules 208 via the interconnects 1140, shown in FIG. 12, for each of the respective bays 230.

Figure 14:
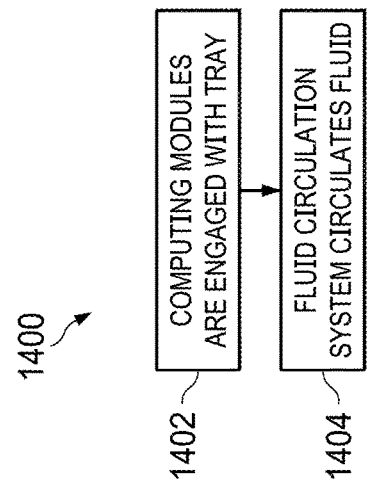

FIG. 14 illustrates a flowchart depicting selected elements of an embodiment of a method 1400 for cooling computing modules of a rack-mountable tray. The method 1400 may be performed by the information handling system 100, the information handling system 202, the cooling management computing module 210, the CDU 204, and/or the tray 206, and with reference to FIGS. 1-13. It is noted that certain operations described in method 1400 may be optional or may be rearranged in different embodiments.

The computing modules 208 are engaged with cold fluid intakes 1150 and warm fluid returns 1160 of one or more bays 1130 of the tray 206 (1402). The fluid circulation system 220 circulates fluid within the computing modules 208 by introducing fluid, for each computing module 208, within the computing module 208 via the cold fluid intake 1150 of each bay 1130 that is engaged with the computing module 208 and returning warm fluid via the warm fluid return 1160 of each bay 1130 that is engaged with the computing module 208 to transfer heat from the computing module 208 (1404).

Figure 15:
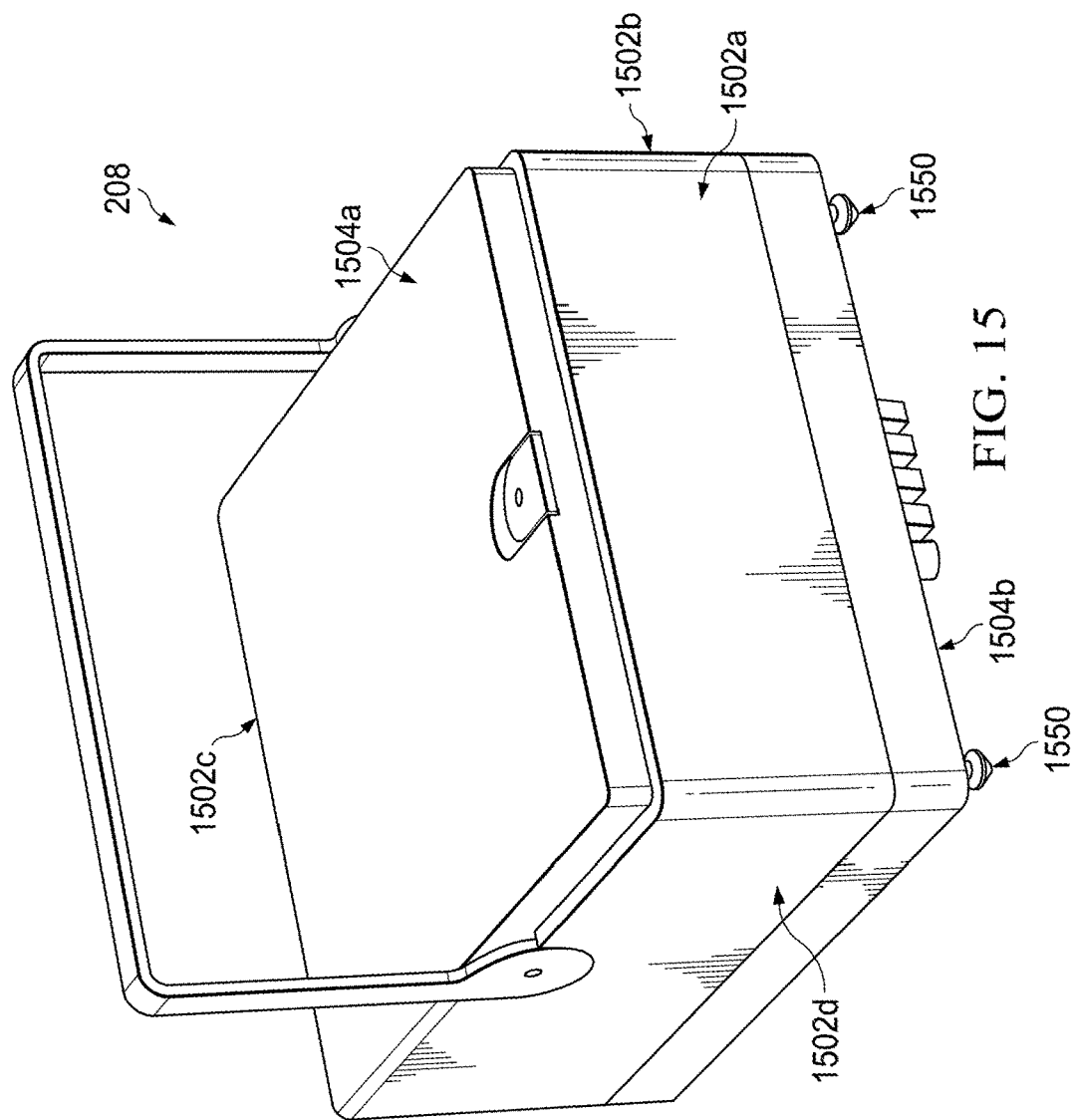
FIGS. 15, 16 illustrate perspective views of the computing module.
Figure 16:
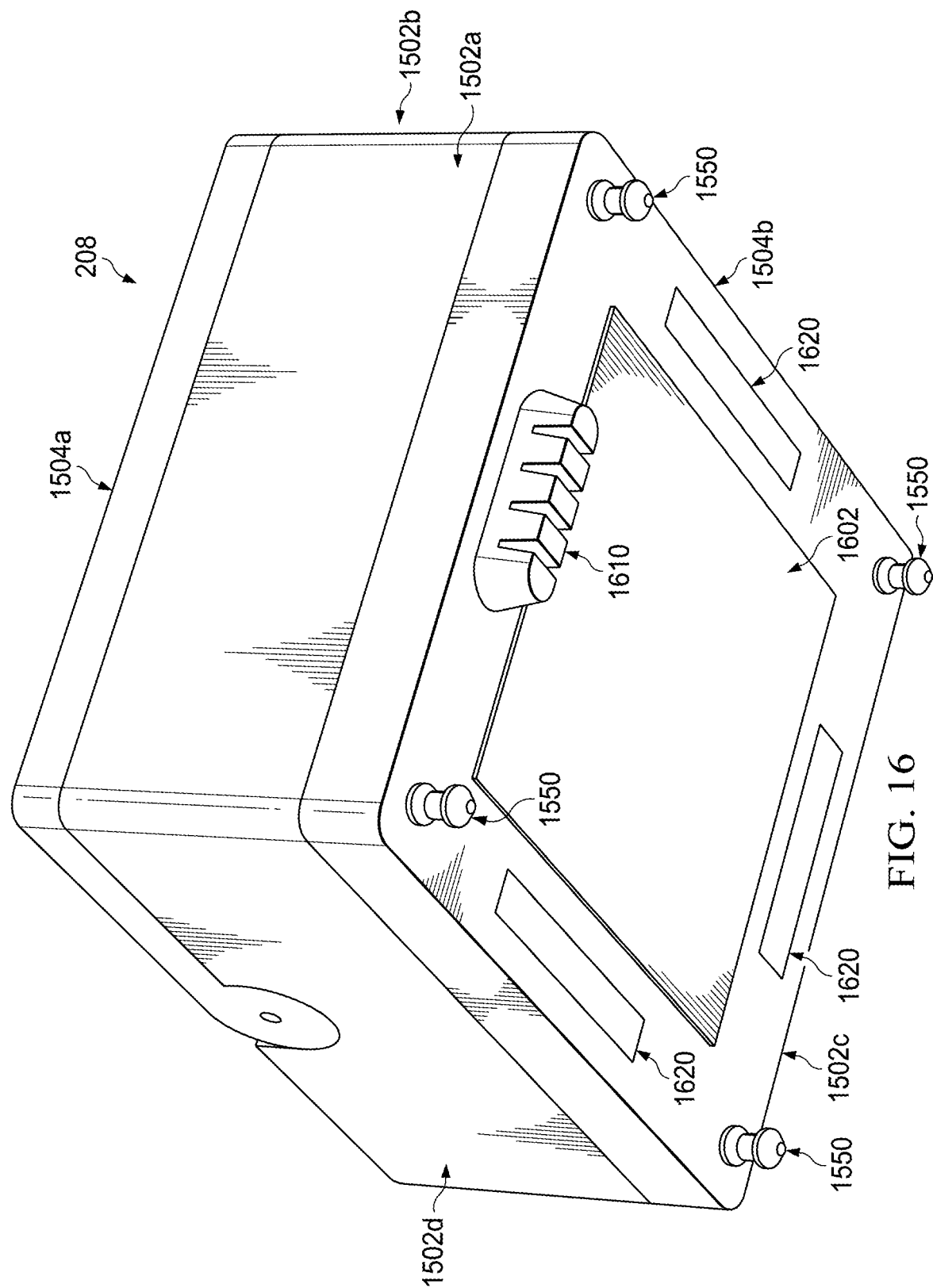

FIGS. 15, 16 illustrate an example of the computing module 208. FIG. 15 illustrates a top down perspective view of the computing module 208, and FIG. 16 illustrates a bottom up perspective view of the computing module 208. In some examples, the computing module 208 can be cooled by immersion cooling. In short, the computing module 208 is a sealed unit which can include computing components that is filled with an immersion fluid (or dielectric fluid) to facilitate cooling of the computing module 208 and the computing components, described further herein.

The computing module 208 can include walls 1502a, 1502b, 1502c, 1502d (collectively referred to as walls 1502). The computing module 208 can further include a top surface 1504a and a bottom surface 1504b positioned opposite to the top surface 1504b (collectively referred to as surfaces 1504). The walls 1502 and the surfaces 1504 can define an interior volume within the computing module 208. The walls 1502 and the surfaces 1504 can form any geometric shape as desired such that the interior volume is defined; and the computing module 208 can have any number of walls 1502. The walls 1502 and the surfaces 1504 can have any size/shape as desired (e.g., based on a size of the tray 206).

The interior volume of the computing module 208 is sealed from an outside environment of the computing module 208 via the walls 1502 and the surfaces 1504. For example, when the computing module 208 is engaged with the tray 206 (as shown in FIGS. 4A, 4B), the interior volume of the computing module 208 is sealed from an environment including the tray 206, such as a rack, or a server cluster that includes the rack.

Figure 17:
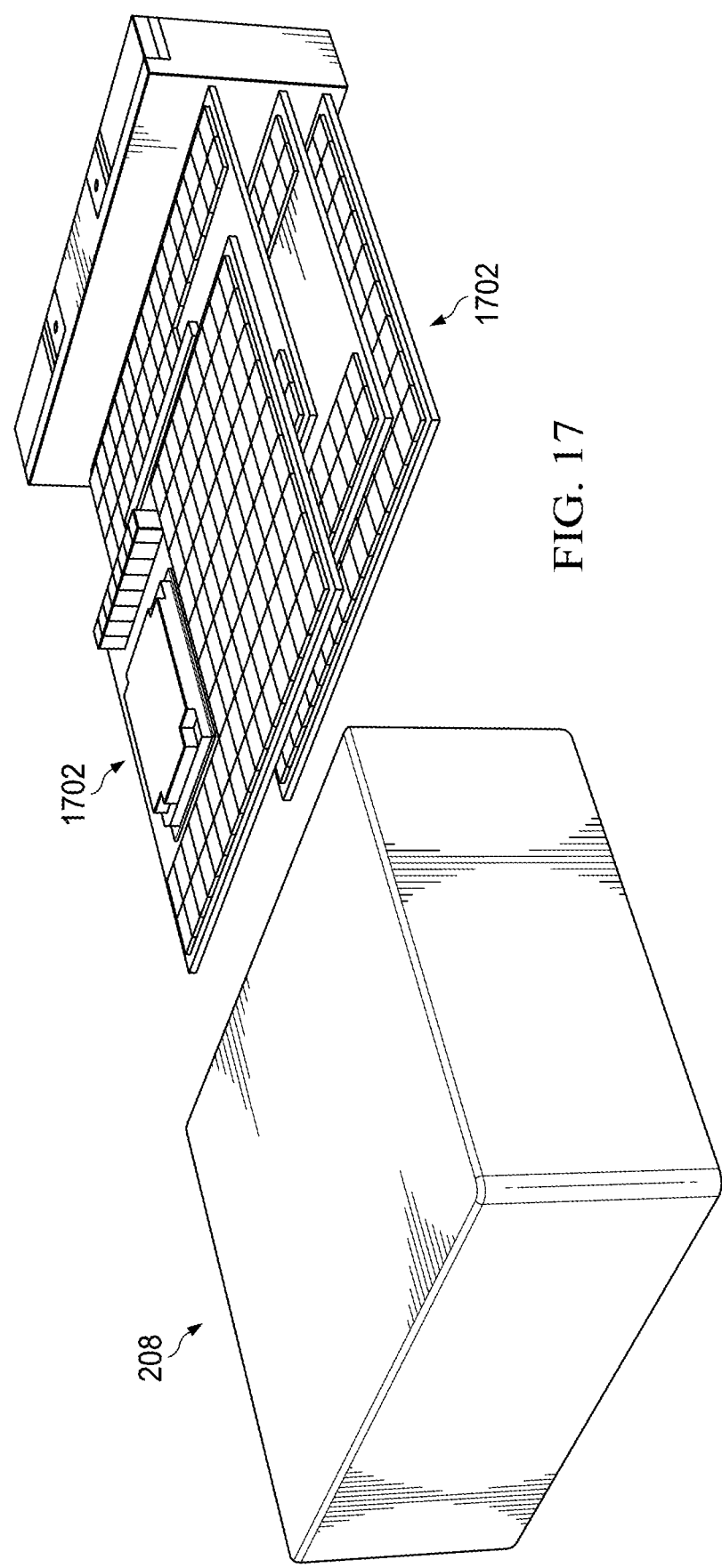
FIG. 17 illustrates computing components of the computing module.

FIG. 17 illustrates an exploded view of the computing module 208. The computing module 208 can include computing components 1702. The computing components 1702 can be positioned within the interior volume of the computing module 208. In some examples, the computing components 1702 can include one or more of memory, processors, storage devices, and/or any type of computing component/accessory.

The computing module 208 can further include an immersion fluid contained within the interior volume of the computing module 208. The immersion fluid can surround the computing components 1702. In some examples, the immersion fluid is a di-electric fluid. In some examples, the immersion fluid is a dielectric fluid.

Referring back to FIGS. 15 and 16, the computing module 208 can further include mechanical interconnects 1550. The mechanical interconnects 1550 can couple the computing module 208 to the tray 206. For example, the mechanical interconnects 1550 can engage with the mechanical interconnects 240 of the bay 230, as shown in FIG. 3.

Figure 18:
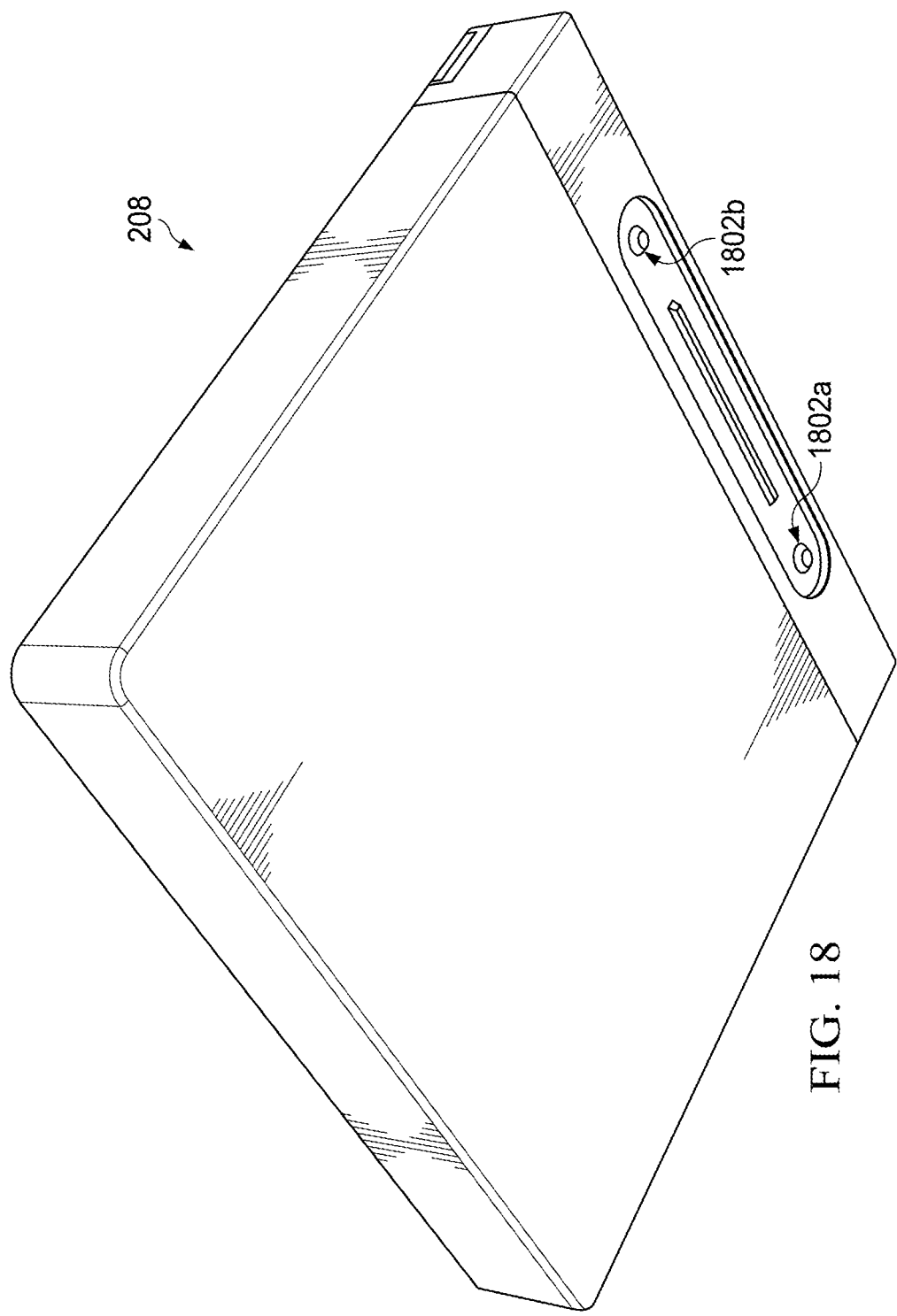
FIG. 18 illustrates ports of the computing module.

Referring to FIG. 18, the computing module 208 is shown including a cold fluid intake 1802 and a warm fluid return 1804. The intake 1802 and the return 1804 can be utilized for fluid exchange, e.g., with the tray 206. When the computing module 208 is mechanically coupled with the tray 206 (via the mechanical interconnects 240, 1550), the cold fluid intake 1802 of the computing module 1802 can be coupled with (engaged with) the cold fluid intake 1150 of the respective bay 1130 of the tray 206; and the warm fluid return 1804 of the computing module 1802 can be coupled with (engaged with) the warm fluid return 1160 of the respective bay 1130 of the tray 206.

Specifically, with reference to FIGS. 2, 11, 12, and 13, the fluid circulation system 220 can introduce, for each bay 1130 that a respective computing module 208 is engaged with, fluid within the computing module 208 via the cold fluid intake 1802 of the computing module 208 through the cold fluid intake 1150 of each bay 1130; and return warm fluid via the warm fluid return 1804 of the computing module 208 through the warm fluid return 1160 of each bay 1130 to transfer heat from the computing modules 208.

Specifically, the fluid circulation system 220 can circulate fluid within the lines 602, 604 such that fluid is circulated within the computing modules 208. Specifically, the CDU 204, in response to a signal from the cooling management computing module 210, can circulate fluid within the fluid circulation system 220. The fluid circulation system 220 can provide cold/cool temperature fluid within the cold fluid intake lines 602 such that the cold temperature fluid is brought to the computing modules 208, and specifically, within the computing modules 208 through the cold fluid intake 1802 of the computing modules 1802 and the cold fluid intake 1150 of each bay 1130.

The cold temperature fluid can transfer heat from within the computing modules 208. The heat is transferred to the cold temperature fluid which in turn is extracted as warm temperature fluid via the warm fluid return line 604, the warm fluid return 1804 of the computing modules 208, and the warm fluid return 1160 of the bay 1130. In other words, the heat from the computing modules 208 is transferred to cold temperature fluid that is introduced via the cold fluid intakes 1150, 1802. The fluid then can be removed from within the computing module 208 via the warm fluid returns 1160, 1804, thus, transferring heat away from the computing modules 208.

Referring back to FIG. 16, the computing module 208 can further include a thermal plate 1602. The thermal plate 1602 can be positioned on the bottom surface 1504b of the computing module 208. When the computing module 208 is mechanically coupled with the tray 206 (via the mechanical interconnects 240, 1550), the thermal plate 1602 can be positioned proximate to the thermal pad 310 of the respective bay 230. The thermal plate 1602 can transfer heat from the computing module 208 to the thermal plate 1602. Specifically, any heat that is transferred from the computing components 1702 to the immersion fluid of the computing module 208 can be transferred to the thermal plate 1602. The thermal plate 1602 can then transfer such heat to the thermal pad 310 of the bay 230.

Furthermore, in some examples, referring to FIGS. 2, 6, and 16, the fluid circulation system 220 can circulate fluid within the lines 602, 604 such that fluid is circulated within the bays 230, and specifically, proximate to the thermal pads 310. Specifically, the CDU 204, in response to a signal from the cooling management computing module 210, can circulate fluid within fluid circulation system 220. The fluid circulation system 220 can provide cold/cool temperature fluid within the cold fluid intake lines 602 such that the cold/cool temperature fluid is brought to the bays 230, and specifically, proximate or within the thermal pads 310.

The thermal pads 310 can transfer heat from the immersion fluid within the computing modules 208 via the cold temperature fluid such that heat is transferred from the computing modules 208 to the thermal pads 310. The heat is transferred to the cold temperature fluid which in turn is extracted as warm temperature fluid via the warm fluid return line 604. In other words, the heat from the computing modules 208 is transferred to the thermal pads 208 that is in turn transferred to the fluid within the fluid circulation system 220. The fluid then can be removed from being proximate to the thermal pads 310, thus, transferring heat away from the computing modules 208, the bays 230, and the thermal pads 310. In some examples, the fluid is a water-based fluid.

Referring to FIG. 16, the computing module 208 can further include power interconnects 1610. The power interconnects 1610 can engage with the power interconnects 342 of the bay 230 of the tray 260 for power coupling with the tray 206, and specifically, with the power delivery system 224. The computing module 208 can further include data interconnects 1620. The data interconnects 1620 can engage with the data interconnects 344 of the bay 230 of the tray 260 for data coupling with the tray, and specifically, with the data delivery system 222.

The above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

Herein, "or" is inclusive and not exclusive, unless expressly indicated otherwise or indicated otherwise by context. Therefore, herein, "A or B" means "A, B, or both," unless expressly indicated otherwise or indicated otherwise by context. Moreover, "and" is both joint and several, unless expressly indicated otherwise or indicated otherwise by context. Therefore, herein, "A and B" means "A and B, jointly or severally," unless expressly indicated otherwise or indicated other-wise by context.

The scope of this disclosure encompasses all changes, substitutions, variations, alterations, and modifications to the example embodiments described or illustrated herein that a person having ordinary skill in the art would comprehend. The scope of this disclosure is not limited to the example embodiments described or illustrated herein. Moreover, although this disclosure describes and illustrates respective embodiments herein as including particular components, elements, features, functions, operations, or steps, any of these embodiments may include any combination or permutation of any of the components, elements, features, functions, operations, or steps described or illustrated anywhere herein that a person having ordinary skill in the art would comprehend. Furthermore, reference in the appended claims to an apparatus or system or a component of an apparatus or system being adapted to, arranged to, capable of, configured to, enabled to, operable to, or operative to perform a particular function encompasses that apparatus, system, component, whether or not it or that particular function is activated, turned on, or unlocked, as long as that apparatus, system, or component is so adapted, arranged, capable, configured, enabled, operable, or operative.

What is claimed is:

1. An information handling system, comprising:
  a plurality of computing modules, each computing module of the plurality of computing modules including a thermal plate;
  a rack-mountable tray including:
    a plurality of bays and a plurality of thermal pads, each bay of the plurality of bays including i) a respective thermal pad of the plurality of thermal pads, ii) a cold fluid intake, and iii) a warm fluid return, wherein each computing module of the plurality of computing modules is engaged with the cold fluid intake and the warm fluid return of a respective bay of the plurality of bays, and the thermal plate of the computing module is in thermal communication with the thermal pad of the respective bay to transfer heat from the thermal plate of the computing module to the thermal pad of the respective bay; and
    a fluid circulation system positioned within the rack-mountable tray, the fluid circulation system including a cold fluid intake line coupled to the cold fluid intake of each of the plurality of bays and a warm fluid return line coupled to the warm fluid return of each of the plurality of bays, the fluid circulation system;
      introducing, for each bay of the plurality of bays that a respective computing module of the plurality of computing modules is engaged with, a fluid within the computing module via the cold fluid intake of the bay to transfer heat from components of the computing module to the fluid and transfer heat from the fluid to the thermal plate of the computing module and returning warm fluid via the warm fluid return of the bay, and
      circulating, for each bay of the plurality of bays that a respective computing module of the plurality of computing modules is engaged with, additional fluid via the cold fluid intake line proximate to the thermal pad of the bay to transfer heat from the thermal pad to the additional fluid and return the additional fluid via the warm fluid return line.

2. The information handling system of claim 1, wherein each of the plurality of bays further includes one or more interconnects for engaging with the respective computing module of the plurality of computing modules.

3. The information handling system of claim 2, wherein the rack-mountable tray further includes a data delivery system and a power delivery system, wherein the interconnects couple the plurality of computing modules with the data delivery system and the power delivery system.

4. The information handling system of claim 1, wherein the fluid is a water-based fluid.

5. The information handling system of claim 1, further including an air circulation system coupled to the rack-mountable tray to further transfer heat from the plurality of computing modules.

6. The information handling system of claim 1, wherein a particular computing module of the plurality of computing modules is engaged with at least two bays of the plurality of bays.

7. An apparatus, comprising:
  a rack-mountable tray, including:
    a plurality of bays and a plurality of thermal pads, each bay of the plurality of bays including i) a respective thermal pad of the plurality of thermal pads, ii) a cold fluid intake, and iii) a warm fluid return, wherein each computing module of a plurality of computing modules is engaged with the cold fluid intake and the warm fluid return of a respective bay of the plurality of bays, and a thermal plate of the computing module is in thermal communication with the thermal pad of the respective bay to transfer heat from the thermal plate of the computing module to the thermal pad of the respective bay; and a fluid circulation system positioned with in the rack-mountable tray, the fluid circulation system including a cold fluid intake line coupled to the cold fluid intake of each of the plurality of bays and a warm fluid return line coupled to the warm fluid return of each of the plurality of bays, the fluid circulation system:

introducing, for each bay that a respective computing module of the plurality of computing modules is engaged with, a fluid within the computing module via the cold fluid intake of the bay to transfer heat from components of the computing module to the fluid and transfer heat from the fluid to the thermal plate of the computing module and returning warm fluid via the warm fluid return of the bay, and circulating, for each bay of the plurality of bays that a respective computing module of the plurality of computing modules is engaged with, additional fluid via the cold fluid intake line proximate to the thermal pad of the bay to transfer heat from the thermal pad to the additional fluid and return the additional fluid via the warm fluid return line.

8. The apparatus of claim 7, wherein each of the plurality of bays further includes one or more interconnects for engaging with the respective computing module of the plurality of computing modules.

9. The apparatus of claim 8, wherein the rack-mountable tray further includes a data delivery system and a power delivery system, wherein the interconnects couple the plurality of computing modules with the data delivery system and the power delivery system.

10. The apparatus of claim 7, wherein the fluid is a water-based fluid.

11. The apparatus of claim 7, wherein the fluid is a dielectric-based fluid.

12. The apparatus of claim 7, further including an air circulation system coupled to the rack-mountable tray to further transfer heat from the plurality of computing modules.

13. The apparatus of claim 7, wherein a particular computing module of the plurality of computing modules is engaged with at least two bays of the plurality of bays.

14. A method of cooling a plurality of computing modules, comprising:

engaging each computing module of the plurality of computing modules with a respective bay of a plurality of bays of a rack mountable tray, including engaging each computing module of the plurality of computing modules with a cold fluid intake and a warm fluid return of the respective bay, such that, for each computing module, a thermal plate of the computing module is positioned proximate to a thermal pad of the respective bay to place the thermal pad of the respective bay in thermal communication with the thermal plate of the computing module to transfer heat form the thermal plate of the computing module to thermal pad of the respective bay;

introducing fluid, for each computing module of the plurality of computing modules, within the computing module via the cold fluid intake of the respective bay that is engaged with the computing module and coupled to a cold fluid intake line to transfer heat from components of the computing module to the fluid and transfer heat from the fluid to the thermal plate of the computing module and returning warm fluid via the warm fluid return of the respective bay that is engaged with the computing module and coupled to a warm fluid return line; and circulating, for each bay of the plurality of bays that a respective computing module of the plurality of computing modules is engaged with, additional fluid via the cold fluid intake line proximate to the thermal pad of the bay to transfer heat from the thermal pad to the additional fluid and return the additional fluid via the warm fluid return line.

15. The method of claim 14, wherein engaging each computing module of the plurality of computing modules with a respective bay of the plurality of bays further includes engaging each computing module of the plurality of computing modules with one or more interconnects of the respective bay.

16. The method of claim 15, wherein engaging each computing module of the plurality of computing modules with one or more interconnects of the respective bay further includes coupling each computing module of the plurality of computing modules with a data delivery system and a power delivery system through the interconnects.

17. The method of claim 14, wherein the fluid is a water-based fluid.

18. The method of claim 14, wherein the fluid is a dielectric-based fluid.

19. The method of claim 14, further including circulating air over the plurality of computing modules to further transfer heat from the plurality of computing modules.

20. The method of claim 14, wherein engaging each computing module of the plurality of computing modules with one or more bays further includes engaging a particular computing module of the plurality of computing modules with at least two bays of the plurality of bays.

* * * * *